(12) United States Patent
Hirayama (10) Patent No.: US 9,270,001 B2
(45) Date of Patent: Feb. 23, 2016

(54) FLEXIBLE CIRCUIT BOARD

(71) Applicant: Sumitomo Electric Device Innovations, Inc., Yokohama-shi (JP)

(72) Inventor: Masahiro Hirayama, Yokohama (JP)

(73) Assignee: Sumitomo Electric Device Innovations, Inc., Yokohama-shi (JP)

( * ) Notice: Subject to any disclaimer, the term of this patent is extended or adjusted under 35 U.S.C. 154(b) by 326 days.

(21) Appl. No.: 13/935,132

(22) Filed: Jul. 3, 2013

(65) Prior Publication Data
US 2013/0322833 A1 Dec. 5, 2013
US 2014/0254992 A9 Sep. 11, 2014

(30) Foreign Application Priority Data

Jul. 4, 2012 (JP) ................................ 2012-150848
May 30, 2013 (JP) ................................ 2013-114537

(51) Int. Cl.
| | | |
|---|---|---|
| G02B 6/36 | (2006.01) | |
| H01P 3/02 | (2006.01) | |
| G02B 6/42 | (2006.01) | |
| H05K 1/02 | (2006.01) | |
| H05K 1/11 | (2006.01) | |

(52) U.S. Cl.
CPC .............. *H01P 3/026* (2013.01); *G02B 6/4279* (2013.01); *G02B 6/4281* (2013.01); *H05K 1/025* (2013.01); *G02B 6/4292* (2013.01); *H05K 1/0219* (2013.01); *H05K 1/0227* (2013.01); *H05K 1/0253* (2013.01); *H05K 1/117* (2013.01); *H05K 2201/0969* (2013.01); *H05K 2201/09181* (2013.01); *H05K 2201/09236* (2013.01); *H05K 2201/09618* (2013.01)

(58) Field of Classification Search
USPC .......................................................... 385/14
See application file for complete search history.

(56) References Cited

U.S. PATENT DOCUMENTS

| | | | |
|---|---|---|---|
| 2011/0278047 A1 | 11/2011 | Yamauchi et al. | |
| 2012/0120619 A1* | 5/2012 | Kodera | 361/749 |
| 2013/0176739 A1* | 7/2013 | Uehara | 362/296.01 |
| 2013/0271265 A1* | 10/2013 | Finn | 340/10.1 |
| 2013/0322833 A1* | 12/2013 | Hirayama | 385/92 |
| 2014/0176840 A1* | 6/2014 | Hashido | 349/33 |
| 2014/0240624 A1* | 8/2014 | Misaki | 349/12 |
| 2014/0267683 A1* | 9/2014 | Bibl et al. | 348/87 |

FOREIGN PATENT DOCUMENTS

JP 2011-238883 A 11/2011

\* cited by examiner

*Primary Examiner* — Sung Pak
(74) *Attorney, Agent, or Firm* — Venable LLP; Michael A. Sartori (57) ABSTRACT

A flexible circuit board includes: an insulative substrate having a first surface and a second surface opposite to the first surface; a microstrip line having a first signal line formed on the first surface and a first ground pattern formed on the second surface and located in an area opposite to the first signal line; a coplanar line having a second signal line formed on the first surface, and second ground patterns that are formed on the first surface and are spaced apart from both sides of the second signal line; a connection line that is formed on the first surface and connects the first signal line and the second signal line together, the connection line having an opening; and third ground patterns formed on the second surface and arranged in areas located at both sides of an area opposite to the connection line including the opening.

15 Claims, 14 Drawing Sheets

FLEXIBLE CIRCUIT BOARD

CROSS-REFERENCE TO RELATED APPLICATION

This application is based upon and claims the benefit of priority of the prior Japanese Patent Application Nos. 2012-150848 and 2013-114537, filed on Jul. 4, 2012 and May 30, 2013, respectively, the entire contents of which are incorporated herein by reference.

BACKGROUND (i) Technical Field

The present invention relates to a flexible circuit board, and more particularly, to a flexible circuit board having a converter that interconnects a coplanar line and a microstrip line.

(ii) Related Art

A flexible printed circuit board (FPC) is used for interconnecting electronic circuits (see Japanese Patent Application Publication No. 2011-238883, for example). Pads to which lead pins of a package are connected are formed at opposite ends of the flexible printed circuit board. The pads are formed by coplanar lines, and a microstrip line is formed as a line for connecting the pads together.

In some cases, impedance matching between the coplanar line and the microstrip line may not be established in a position where a connection between these lines is made.

SUMMARY

According to an aspect of the present invention, impedance matching between a coplanar line and a microstrip line is improved.

According to another aspect of the present invention, there is provided a flexible circuit board including: an insulative substrate having a first surface and a second surface opposite to the first surface; a microstrip line having a first signal line formed on the first surface and a first ground pattern formed on the second surface and located in an area opposite to the first signal line; a coplanar line having a second signal line formed on the first surface, and second ground patterns that are formed on the first surface and are spaced apart from both sides of the second signal line; a connection line that is formed on the first surface and connects the first signal line and the second signal line together, the connection line having an opening; and third ground patterns formed on the second surface and arranged in areas located at both sides of an area opposite to the connection line including the opening.

DETAILED DESCRIPTION

Figure 1:
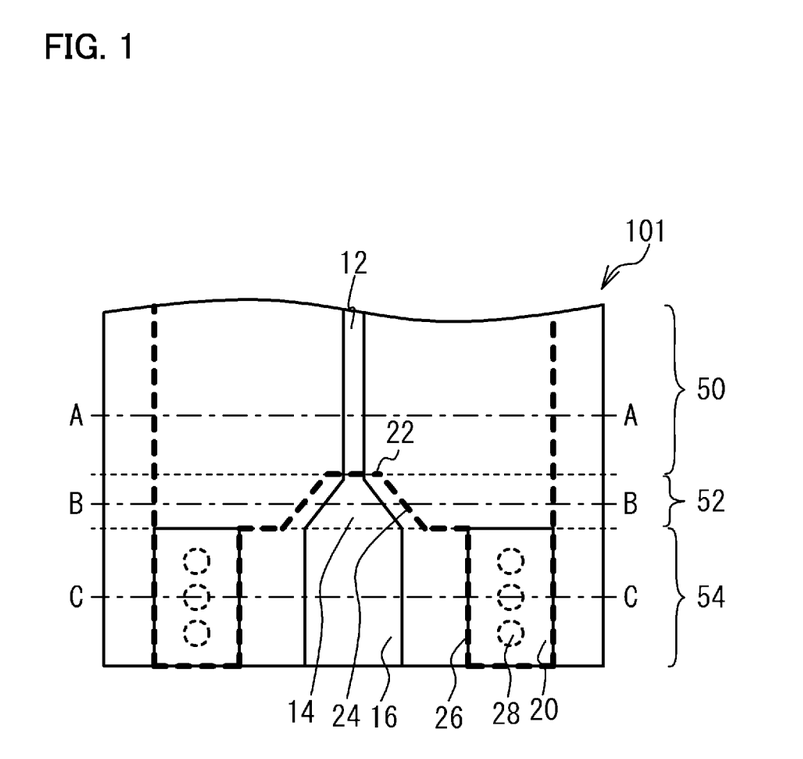
FIG. 1 is a plan view of a flexible circuit board in accordance with a comparative example.
Figure 2A:
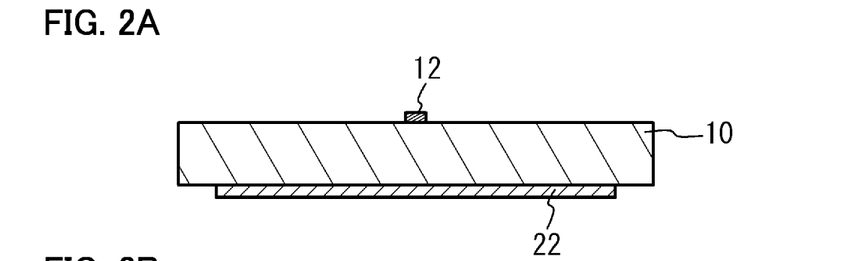
FIGS. 2A, 2B and 2C are respectively cross-sectional views taken along lines A-A, B-B and C-C in FIG. 1.
Figure 2B:
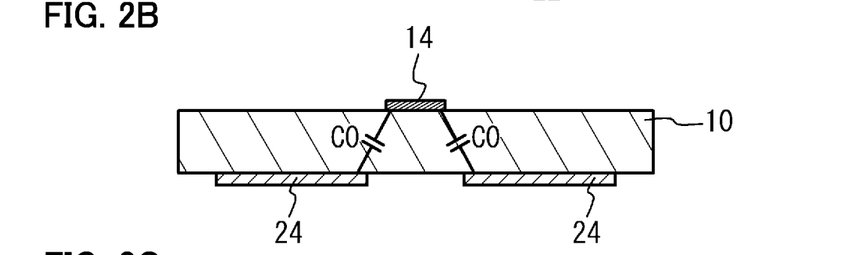
Figure 2C:
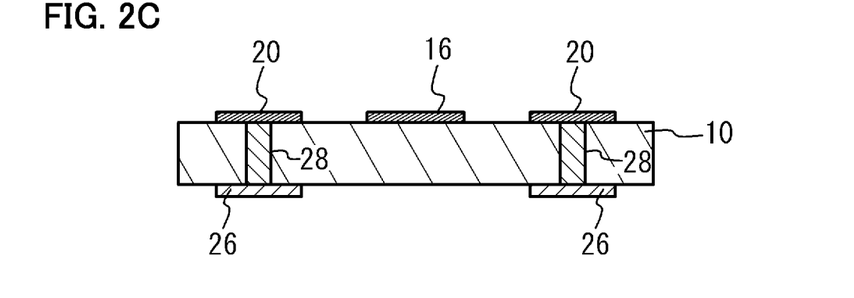

A description is now given of a flexible circuit board in accordance with a comparative example. FIG. 1 is a plan view of a flexible circuit board in accordance with a comparative example. FIGS. 2A through 2C are respectively cross-sectional views taken along lines A-A, B-B and C-C in FIG. 1. As illustrated in FIGS. 1 and 2A through 2C, a printed circuit board 101 has a microstrip line 50, a converter 52, and a coplanar line 54. The microstrip line 50 has an insulative substrate 10 made of resin such as polyimide, a signal line 12 (first signal line) formed on a first surface of the insulative substrate 10, and a ground pattern 22 (first ground pattern) formed on a second surface thereof opposite to the first surface. The signal line 12 and the ground pattern 22 may be made of a metal such as gold (Au).

The coplanar line 54 has a signal line 16 (second signal line) formed on the first surface of the insulative substrate 10, ground patterns 20 (second ground patterns) that are formed on the first surface and are spaced apart from both sides of the signal line 16, and ground patterns 26 formed on the second surface. The ground patterns 26 are not formed in a surface area opposite to the signal line 16 including the opening 15. The ground patterns 26 are formed on the second surface of the insulative substrate 10 and are arranged in areas located at both sides of an area opposite to the connection line 16 including the opening 15. The arrangement of the ground patterns 26 is intended to suppress capacitance components formed by the signal line 16 and the ground patterns 26. The ground patterns 26 are opposite to the ground patterns 20 and may be at ground potential in use. The opposite ground patterns 20 and 26 are interconnected by via metals 28. As described above, the ground patterns 26 are formed in the surface areas opposite to the ground patterns 20, whereby the ground pattern 22 of the microstrip line 50 is electrically connected to the ground patterns 20 via the ground patterns 26. The signal line 16 and the ground patterns 20 and 26 may be made of a metal such as gold.

The converter 52 has a connection line 14 that interconnects the signal lines 12 and 16 formed on the first surface, and ground patterns 24 (third ground patterns) formed on the second surface. Since the signal line 16 is wider than the signal line 12, the connection line 14 has a trapezoidal shape. The ground patterns 24 are provided on the surface of the insulative substrate 10 opposite to the surface on which the connection line 14 is provided. The ground patterns 24 are not provided in the surface areas opposite to the connection line 14 including the opening 15. The ground patterns 24 are formed in areas at both sides of the area opposite to the connection line 14, and have shapes so as to extend along the outer pattern of the connection line 14. Capacitive components C0 are formed between the connection line 14 and the ground patterns 24. The ground patterns 24 electrically connect the ground patterns 20 and 26 together. In the converter 52, a pseudo coplanar line is formed by the connection line 14 and the ground patterns 24. The connection line 14 and the ground patterns 24 may be made of a metal such as gold.

Figure 3A:
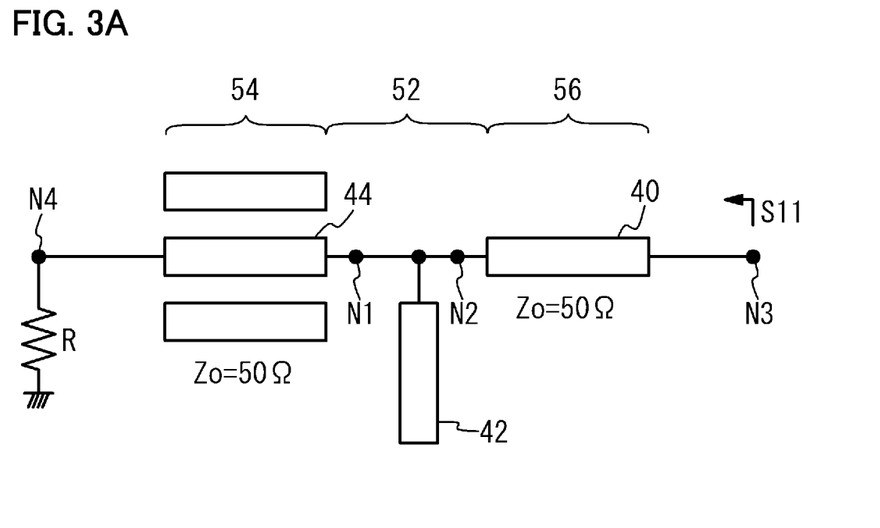
FIG. 3A is an equivalent circuit diagram of the flexible circuit board in accordance with the comparative example.
Figure 3B:
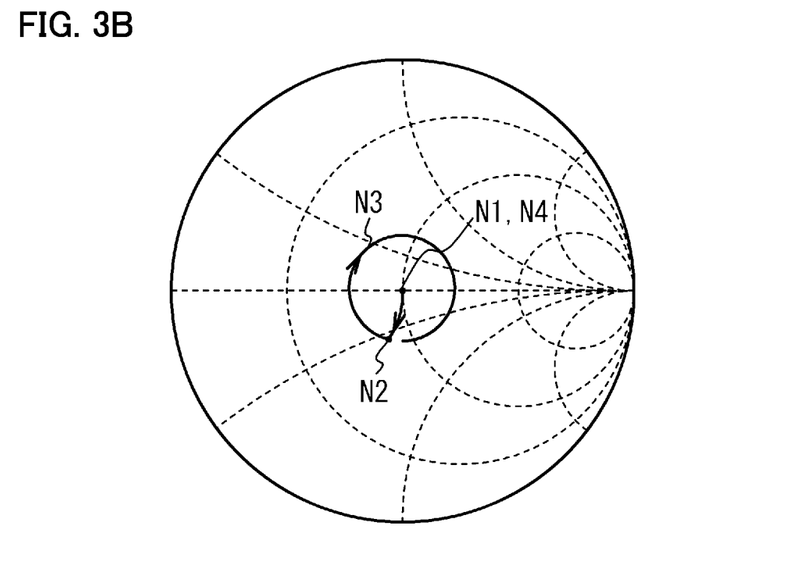
FIG. 3B is a schematic diagram of a Smith chart of S11.

FIG. 3A is an equivalent circuit diagram of the flexible circuit board of the comparative example, and FIG. 3B is a schematic diagram of a Smith chart of S11. Referring to FIG. 3A, the coplanar line 54, the converter 52 and the microstrip line 50 are connected between a node N4 and a node N3. The coplanar line 54 is expressed as a distributed constant line 44. The converter 52 is expressed as an open stub having a capacitive component. A node N1 is defined as a node between the coplanar line 54 and the converter 52, and a node N2 is defined as a node between the converter 52 and the microstrip line 50. It is assumed that the characteristic impedances Zo of the distributed constant lines 40 and 44 are 50Ω. The node N4 is terminated at an impedance of 50Ω by a resistor R. For example, a terminal having an input or output impedance of 50Ω is connected to the node N4. S11 viewed from the node N3 side is described below.

As illustrated in FIG. 3B, S11 of the impedance at the node N4 and S11 of the impedance viewed toward the node N4 from the node N1 are both 50Ω. Therefore, S11 at the node N1 and S11 at the node N4 are located at the center of the Smith chart. S11 at the node N2 deviates from the center due to the capacitive component of the open stub 42. At the node N3, S11 rotates circumferentially about the center of the Smith chart from the node N2. As described above, S11 from the node N2 to N3 deviates from the center of the Smith chart, and the transmission characteristics are thus degraded.

First Embodiment

Figure 4:
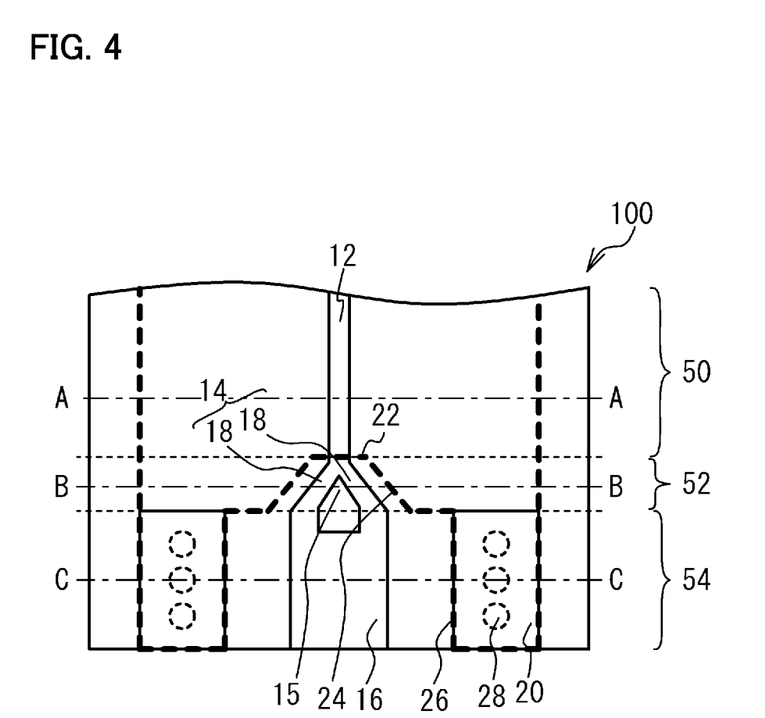
FIG. 4 is a plan view of a flexible circuit board in accordance with a first embodiment.
Figure 5A:
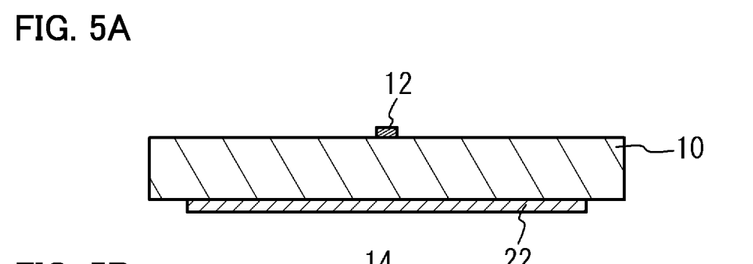
FIGS. 5A, 5B and 5C are respectively cross-sectional views taken along lines A-A, B-B and C-C in FIG. 4.
Figure 5B:
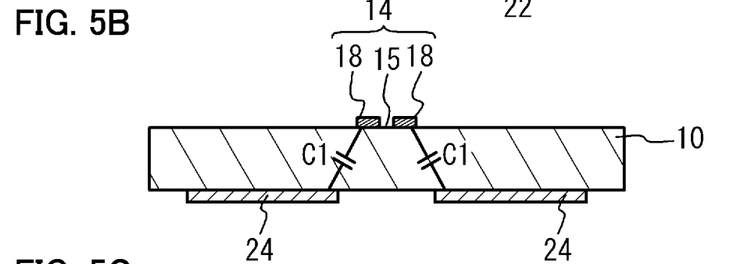
Figure 5C:
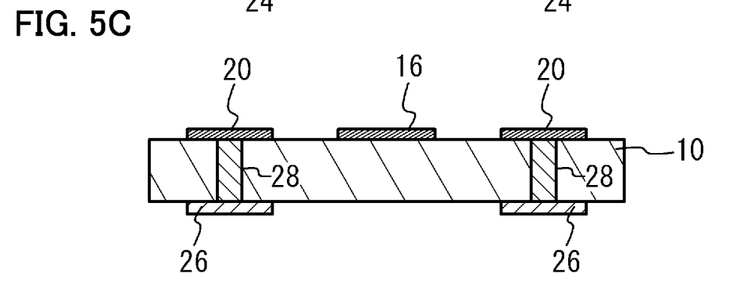

FIG. 4 is a plan view of a flexible circuit board in accordance with a first embodiment. FIGS. 5A, 5B and 5C are respectively cross-sectional views taken along lines A-A, B-B and C-C in FIG. 4. Referring to FIG. 4 and FIGS. 5A through 5C, a flexible circuit board 100 has an opening 15 formed in the connection line 14. The opening 15 is located in the converter 52, whereby the capacitive components C1 between the connection line 14 and the ground patterns 24 are suppressed or reduced. It is thus possible to improve the impedance matching between the coplanar line 54 and the microstrip line 50 implemented by the converter 52. The opening 15 is formed in the conductor of the connection line 14. The inside of the opening 15 is an empty space, and is not full of the resin formed into the insulative substrate 10. The opening 15 is formed simultaneously when the conductor is patterned into the connection line 14. The other structures of the first embodiment are similar to those of the comparative example illustrated in FIGS. 1 and 2A through 2C, and a description thereof is omitted here.

In the first embodiment, the opening 15 extends up to the signal line 16 in the area next to the converter 52. The extension of the opening 15 up to the signal line 16 reduces the capacitive component in the area next to the converter 52. It is thus possible to improve the impedance matching between the coplanar line 54 and the microstrip line 50 implemented by the converter 52. In the first embodiment, the connection line 14 in the converter 52 has a slope or tapered shape that gradually changes from the coplanar line 54 to the microstrip line 50. However, the shape of the connection line 14 is not limited to the above. For example, the connection line 14 has a stepwise shape having steps. Another exemplary shape of the connection line 14 is a single-stage stepwise shape in which an area having a width equal to that of the signal line 16 of the coplanar line 54 directly joins an area having a width equal to that of the signal line 12 of the microstrip line 50. The ground patterns 20 are arranged at both side of the signal line 16 in the coplanar line 54, while no ground pattern is arranged on the surface of the insulative substrate 10 opposite to the signal line 16. This is similarly applied to variations and other embodiments described below.

Figure 6A:
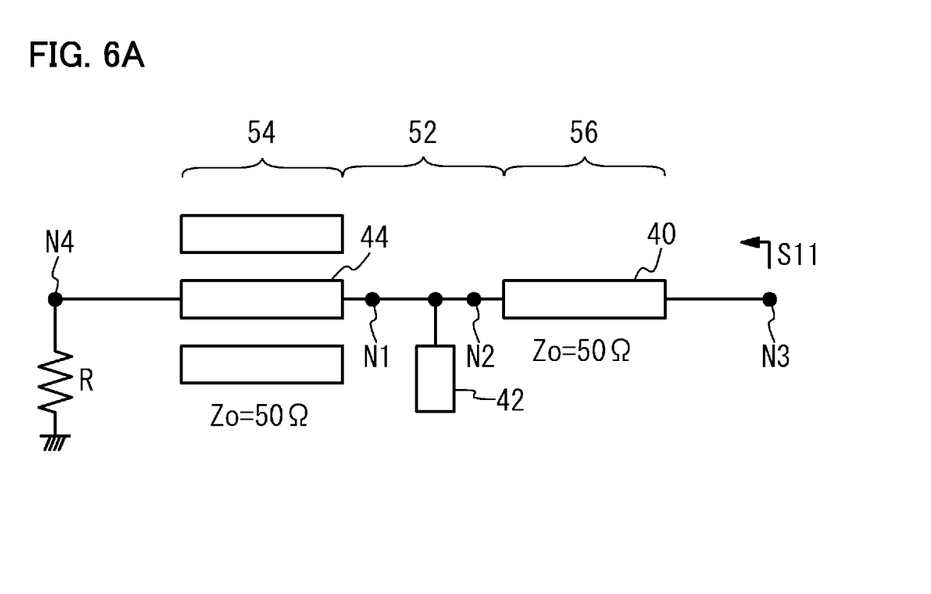
FIG. 6A is an equivalent circuit diagram of the flexible circuit board in accordance with the first embodiment.
Figure 6B:
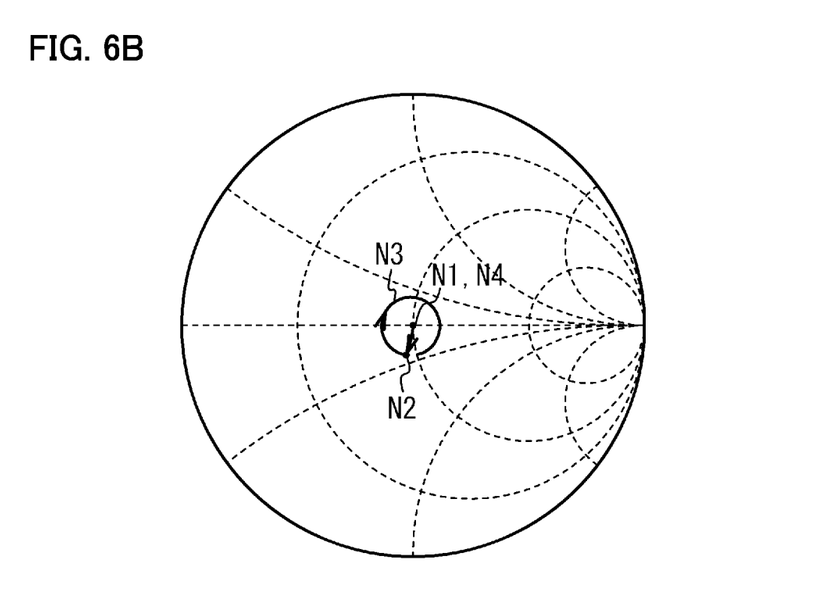
FIG. 6B is a schematic diagram of a Smith chart of S11.

FIG. 6A is an equivalent circuit diagram of the flexible circuit board in accordance with the first embodiment, and FIG. 6B is a schematic diagram of a Smith chart of S11. The coplanar line 54 and the microstrip line 56 have a characteristic impedance of 50Ω. As illustrated in FIG. 6A, the open stub 42 is shorter than the open stub 42 of the comparative example because the converter 52 has the reduced capacitive components. As illustrated in FIG. 6B, the deviation of S11 at the node N2 from the center of the Smith chart is reduced due to the reduced capacitive components in the converter 52. S11 at the node N3 is close to the center of the Smith chart, as compared with the comparative example. Thus, the transmission characteristics are improved according to the first embodiment.

According to the first embodiment, the connection line 14 has the opening 15. The presence of the opening 15 suppresses the capacitive components in the converter 52 and improves the impedance matching between the coplanar line 54 and the microstrip line 50.

For example, the opening 15 branches the connection line 14 into branch lines 18 connected to the signal line 16. When the signal line 12 is narrower than the signal line 16, it is preferable that the branch lines 18 correspond to two edges of an isosceles triangle. It is thus possible to improve the transmission characteristics without any phase difference between the branch lines 18.

As the branch lines 18 are narrower, the opening 15 is larger and the capacitive components are reduced more considerably. The converter 52 of the first embodiment is formed so as to be symmetric about the center axis of the signal line 12. Thus, the branch lines 18 have the same transmission characteristics. It is thus possible to prevent degradation of the transmission characteristics due to the unbalance between the branch lines 18. In the first embodiment, the branch lines 18 are as wide as the signal line 12.

It is preferable that the connection line 14 and the ground patterns 24 do not overlap with each other. In order to avoid the overlapping, it is preferable that a margin is provided when the connection line 14 and the ground patterns 24 are formed. In the first embodiment, a spacing (margin) as much as 50 μm is provided between the edges of the connection line 14 and those of the ground patterns 24.

Figure 7A:
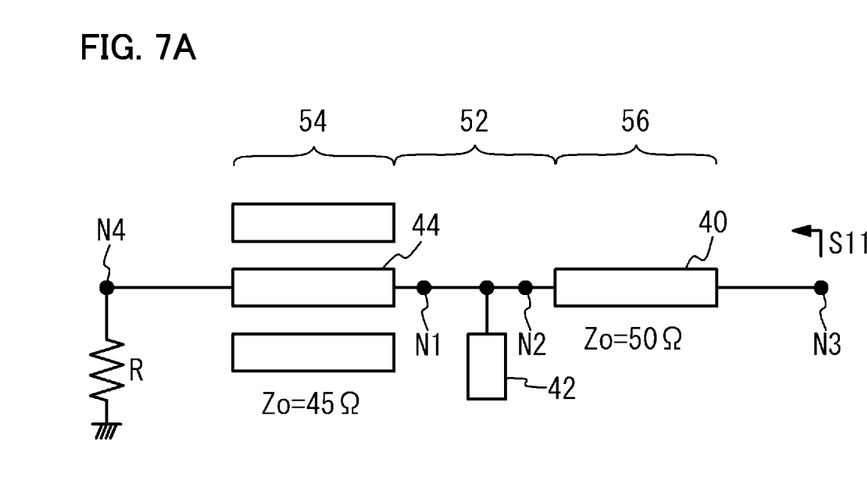
FIG. 7A is an equivalent circuit diagram of a variation of the flexible circuit board in accordance with the first embodiment.
Figure 7B:
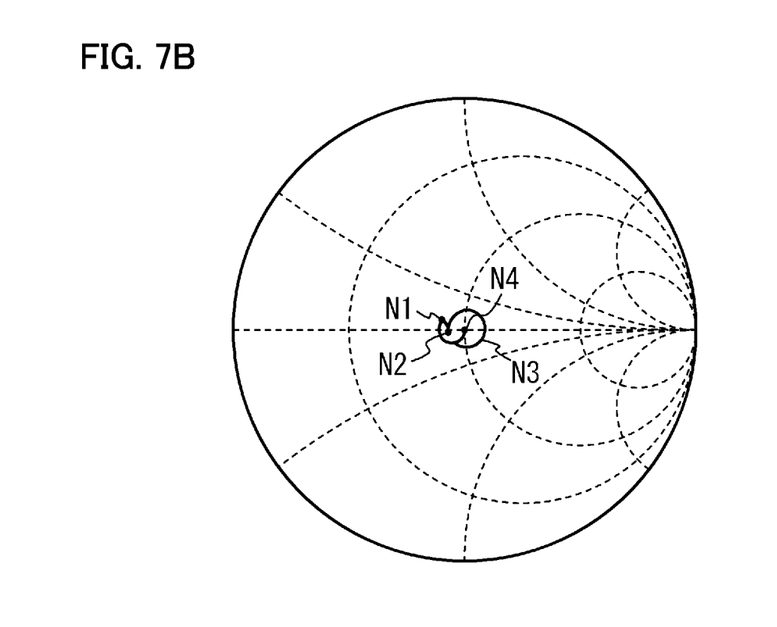
FIG. 7B is a schematic diagram of a Smith chart of S11.

FIG. 7A is an equivalent circuit diagram of a variation of the flexible circuit board of the first embodiment, and FIG. 7B is a schematic diagram of a Smith chart of S11. The coplanar line 54 of the first embodiment has a characteristic impedance of 50Ω, whereas the variation of the first embodiment has a characteristic impedance of 45Ω. The other structures of the variation are the same as those of the first embodiment. As illustrated in FIG. 7B, S11 is 50Ω at the node N4. Since the distributed constant line 44 has a characteristic impedance of 45Ω, S11 at the node N1 depends on the length of the coplanar line 54. The characteristic impedance of the coplanar line 54 may be changed by changing the width of the signal line 16 or the spacing between the ground patterns 20. Further, S11 at the node N2 becomes closer to the center of the Smith chart due to the capacitive component of the open stub 42. S11 at the node N3 rotates about the center of the Smith chart in accordance with the length of the distributed constant line 40.

In the first embodiment, as illustrated in FIG. 6B, S11 at the node N2 deviates from the center of the Smith chart due to the capacitive components in the converter 52. At the node N3, S11 rotates in a circle in accordance with the length of the distributed constant line 40 while S11 always deviates from the center of the Smith chart. On the contrary, in the variation, as illustrated in FIG. 7B, the characteristic impedance of the distributed constant line 44 is made smaller than 50Ω to appropriately move S11 at the node N1 from the center of the Smith chart. Due to the capacitive component of the open stub 42, S11 at the node N2 is made closer to the center of the Smith chart. In this manner, S11 is caused to deviate from the center of the Smith chart with the distributed constant line 44 by the deviation of S11 resulting from the capacitive component. That is, the characteristic impedance of the coplanar line 54 is set smaller than that of the microstrip line 50. It is thus possible to set S11 at the node N3 closer to the center of the Smith chart and improve the transmission characteristics.

Second Embodiment

Figure 8:
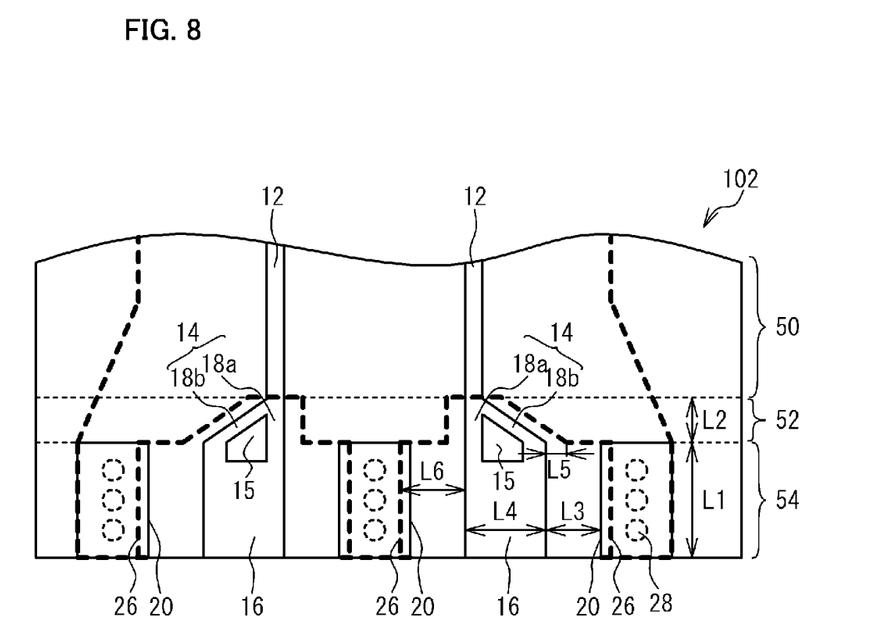
FIG. 8 is a plan view of a flexible circuit board in accordance with a second embodiment.

A second embodiment has an exemplary configuration in which two coplanar lines are used as differential transmission lines. FIG. 8 is a plan view of a flexible circuit board in accordance with the second embodiment. Referring to FIG. 8, a flexible circuit board 102 has microstrip lines 50, converters 52, and coplanar lines 54. The coplanar lines 54 share the ground patterns 20 between the adjacent signal lines 16. The two signal lines 12 are symmetrical about the center line of the shared ground pattern 20, and the two signal lines 16 are symmetrical about the center line of the shared ground pattern 20. Similarly, the two branch lines 18a are symmetrical with respect to the center line of the shared ground pattern 20, and the two branch lines 18b are symmetrical with respect to the center line of the shared ground pattern 20. With the above structure, the phase characteristic between the differential signals is improved. The distance between the two signal lines 16 and that between the two signal lines 12 are equal to each other. Thus, the branch lines 18a and the signal lines 12 are straight lines. The openings 15 have shapes of right triangles. The widths of the signal lines 12 are substantially equal to those of the branch lines 18a, and are arranged in lines. As described above, each of the connection lines is composed of the plurality of branch lines 18a and 18b defined by the corresponding opening 15. One of the branch lines 18a and 18b has a width substantially equal to that of the signal line 12 and is aligned with the signal line 12. Thus, high continuity between the signal line 12 and the branch line 18a is realized, and impedance mismatch at this interface is suppressed.

In the second embodiment, the branch line 18b is narrower than the branch line 18a. The coplanar lines 54 of the second embodiment have the ground patterns provided on both the surface of the insulative substrate 10 on which the signal lines 16 are formed and the surface opposite thereto. In the second embodiment, the distances between the signal lines 16 of the coplanar lines 54 and the ground patterns 20 are smaller than those between the signal lines 16 and the ground patterns 26. For example, the ground patterns 26 in the areas opposite to the ground patterns 20 (patterns at the ground potential in use) are away from the signal lines 16 by a distance larger than the distances between the signal lines 16 and the ground patterns 20. It is thus possible to strengthen the coupling between the signal lines 16 and the ground potential on the surface on which the signal lines 16 are formed.

A computer simulation of S21 and that of the reflection characteristic are now described. In FIG. 8, the lengths L1 of the coplanar lines 54 are 1 mm, and the lengths L2 of the connection lines 14 are 0.22 mm. The lengths L4 of the signal lines 16 are 0.5 mm, and the gaps L3 between the signal lines 16 and the ground patterns 20 are 0.1 mm. The gaps L5 between the signal lines 16 and the ground patterns 24 are 0.05 mm. The gaps L6 between the signal lines 16 and the ground patterns 26 are 0.15 mm. The insulative substrate 10 is an insulator having a relative permittivity of 3.5. In this case, the characteristic impedances of the coplanar lines 54 are 45Ω. The characteristic of the microstrip lines 50 are 50Ω. A comparative example that has no openings 15 is prepared.

Figure 9:
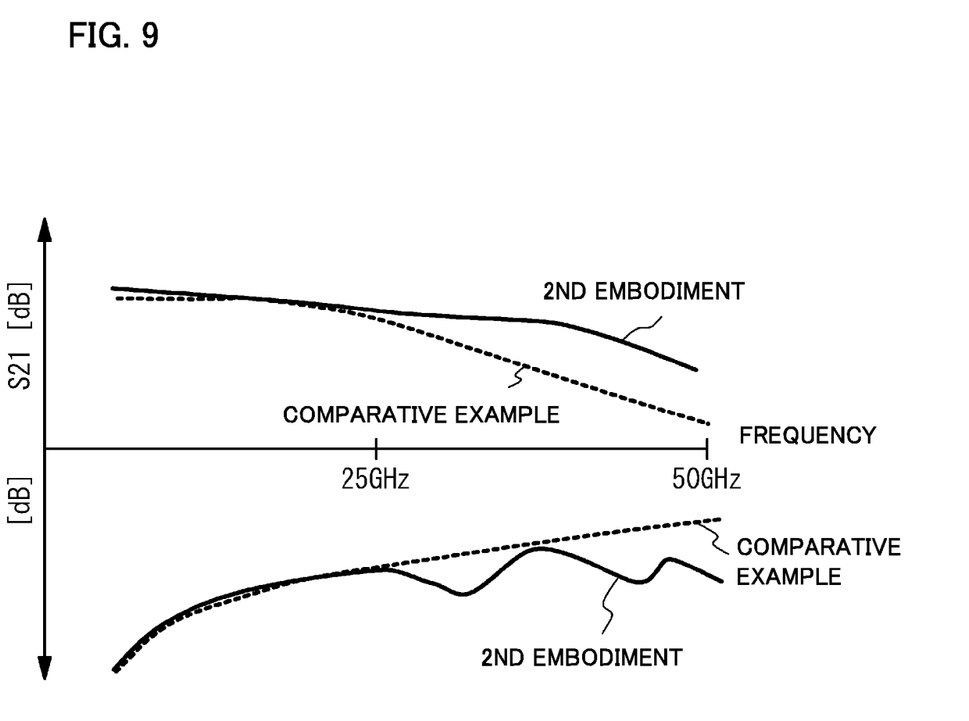
FIG. 9 is a diagram of S21 and a reflection characteristic associated with the frequency.

FIG. 9 is a diagram that illustrates S21 and the reflection characteristic associated with the frequency. S21 denotes the pass characteristic between the opposite ends of the flexible circuit board, and the reflection characteristic is measured by applying a signal to one of the opposite ends of the flexible circuit board. As illustrated in FIG. 9, S21 of the second embodiment is improved as compared with the comparative example at frequencies equal to or higher than 25 GHz. Even at 50 GHz, S21 of the second embodiment is larger than that of the comparative example. The reflection characteristic of the second embodiment is improved as compared with the comparative example at frequencies equal to or higher than 25 GHz. According to the second embodiment, the transmission characteristics are improved, particularly, at a frequency of 25 GHz or higher. Even at frequencies of 30 GHz and 40 GHz, the transmission characteristics are improved. Furthermore, considerable improvements in the transmission characteristics are confirmed even at 50 GHz.

In the second embodiment, as illustrated in FIG. 7B, in order to improve the transmission characteristics, it is preferable that the lengths L1 of the coplanar lines having a characteristic impedance of 45Ω satisfy $\lambda g/4 < L1 < \lambda g/3$ where $\lambda g$ is the signal wavelength at a frequency of 50 GHz. This condition means that L1 is between 0.8 mm and 1.2 mm. It is preferable that $L2 < \lambda g/18$. This condition means that L2 is equal to or smaller than 0.25 mm.

Third Embodiment

Figure 10:
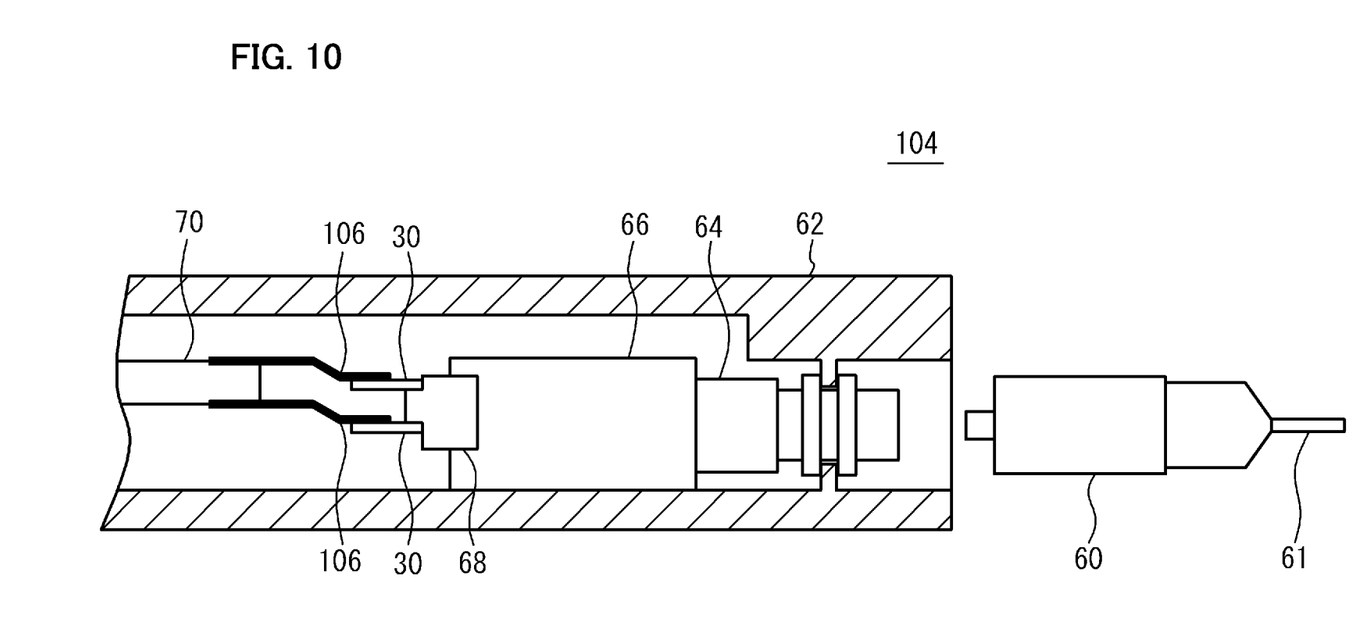
FIG. 10 is a schematic diagram of a third embodiment.

A third embodiment has an exemplary structure in which the first and second embodiments are applied to an optical module. FIG. 10 is a schematic diagram of the third embodiment having an optical module 104. FIG. 10 illustrates a cross section of a housing 62 and side surfaces of other components. In the housing 62, there are provided a receptacle 64, a housing 66, lead pins 30, an insulator 68, a flexible circuit board 106, and a circuit board 70. An optical sub-assembly is composed of the receptacle 64, the housing 66, the lead pins 30 and the insulator 68. A connector 60 to which an optical fiber 61 is connected is inserted into the receptacle 64. A light receiving element and a preamplifier are provided in the housing 66. The light receiving element is a photodiode or the like. The preamplifier amplifies the output of the light receiving element. The light signal input from the optical fiber 61 is converted into an electric signal by the light receiving element, which electric signal is amplified by the preamplifier. The amplified electric signal is transmitted to the circuit board 70 via the insulator 68, the lead pins 3 and the flexible circuit board 106. In the insulator 68, lines for transmitting electric signals and a power supply are provided. The flexible circuit board 106 supplies DC power to circuits in the housing 66. The flexible circuit board 106 transmits RF signals between the circuits in the housing 66 and the circuit board 70.

In the housing 66, there are provided a light emitting element such as a laser diode, and a drive circuit that drives the light emitting element. An electric signal is transmitted from the circuit board 70 to the drive circuit via the flexible circuit board 106, the lead pins 30 and the insulator 68. The drive circuit amplifies the electric signal. The laser diode converts the amplified electric signal into a light signal, which is then output to the optical fiber 61.

Figure 11A:
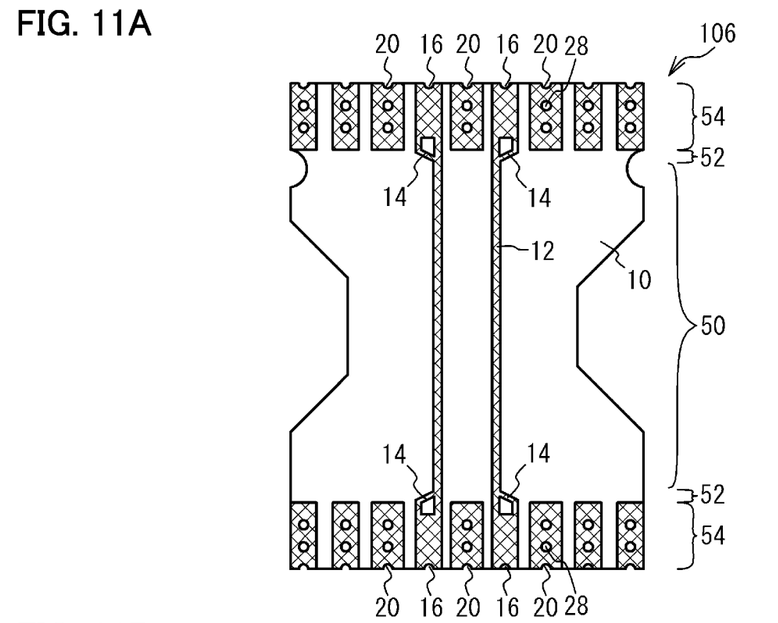
FIGS. 11A and 11B are respectively plan views of first and second surfaces of a flexible circuit board.
Figure 11B:
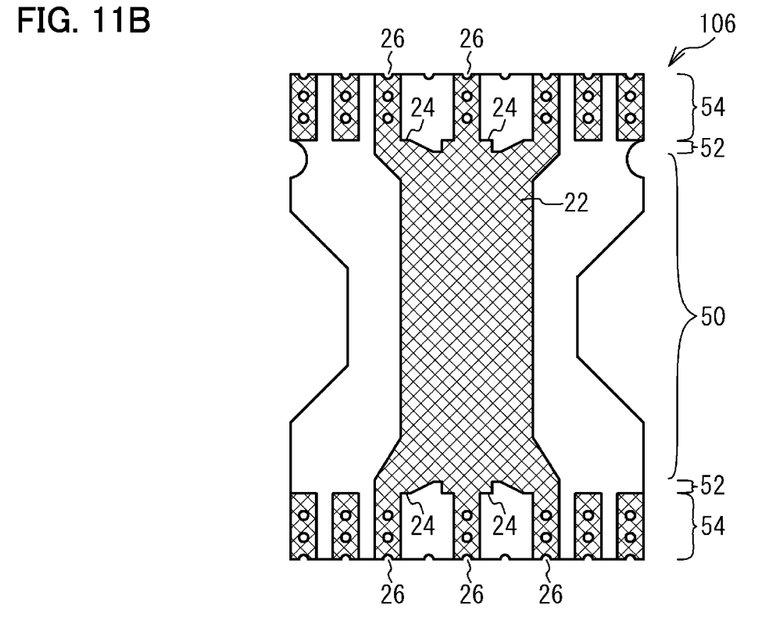

FIGS. 11A and 11B are plan views of first and second surfaces of a flexible circuit board. Coplanar lines 54 are formed at opposite ends of a flexible circuit board 106. Microstrip lines 50 interconnect the coplanar lines 54 at the opposite ends of the flexible circuit board 106. Converters 52 including connection lines 14 having openings 15 are formed between the coplanar lines 54 and the microstrip lines 50. The other structures of the third embodiment are the same as those of the first or second embodiment, and a description thereof is omitted here.

Figure 12:
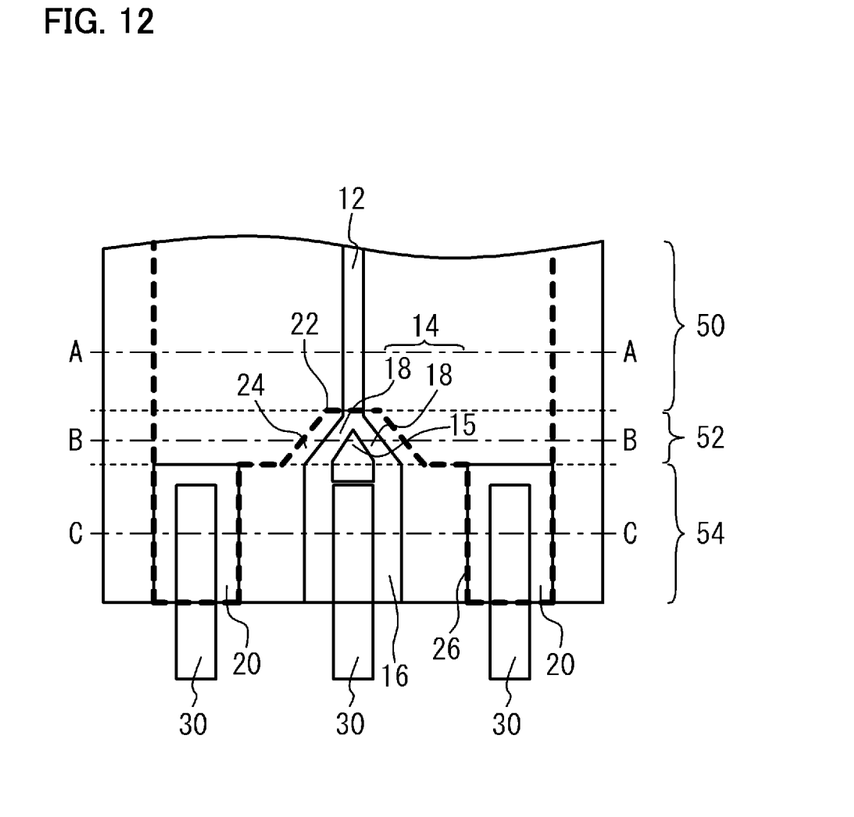
FIG. 12 is a plan view of a flexible circuit board.
Figure 13A:
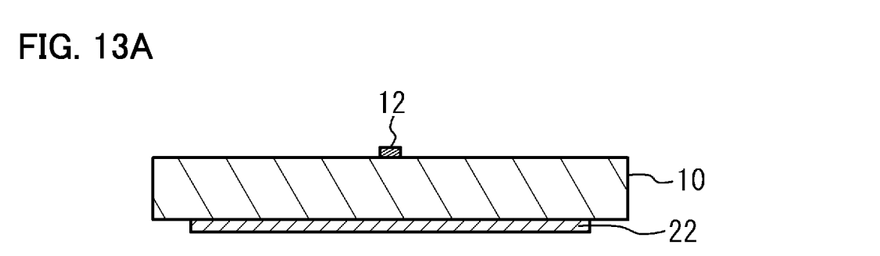
FIGS. 13A, 13B and 13C are respectively cross-sectional views taken along lines A-A, B-B and C-C in FIG. 12.
Figure 13B:
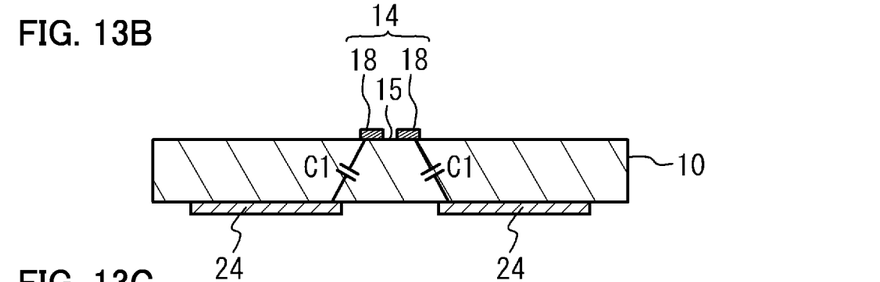
Figure 13C:
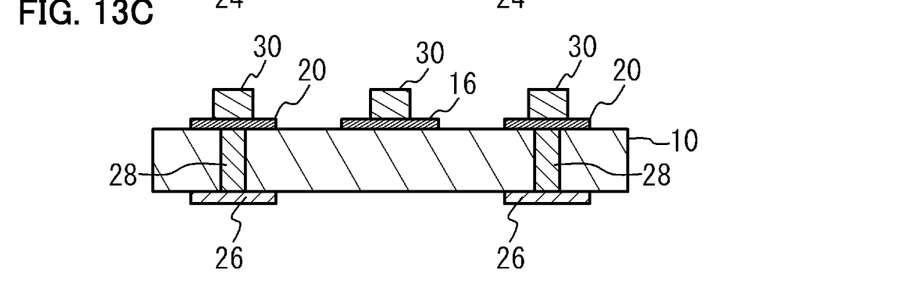

FIG. 12 is a plan view of a flexible circuit board. FIGS. 13A through 13C are respectively cross-sectional views taken along lines A-A, B-B and C-C in FIG. 12. As illustrated in FIG. 12 and FIGS. 13A through 13C, lead pins 30 are joined to the signal lines 16 and the ground patterns 20 of the coplanar lines 54. The other structures of the flexible circuit board are the same as those of the first embodiment, and a description thereof is omitted here.

According to the third embodiment, the optical module 104 is equipped with the flexible circuit board 106 and the optical elements. The optical elements have the lead pins 30 used for inputting or outputting signals. The signal lines 16 of the flexible circuit board 106 are connected to the lead pins 30. It is thus possible to suppress loss of the input/output signals applied to or output from the optical elements as RF signals in the flexible circuit board.

Figure 14A:
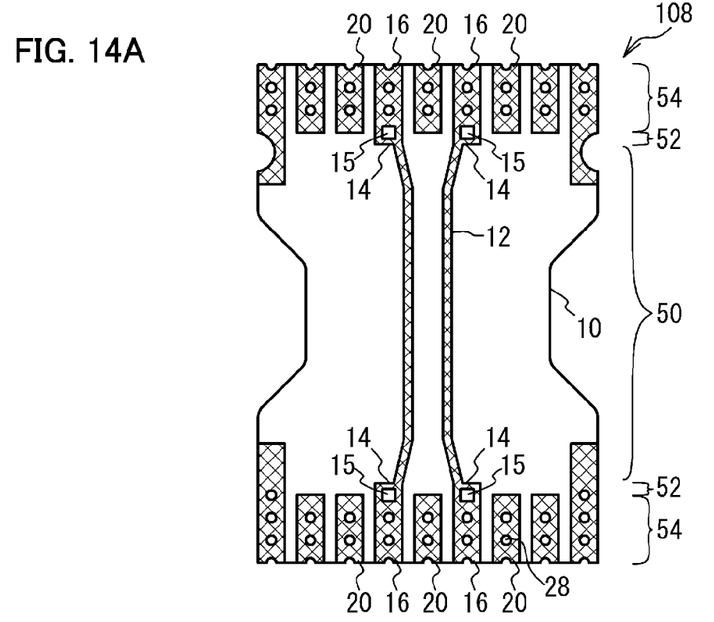
FIGS. 14A and 14B are respectively plan views of first and second surfaces of a flexible circuit board in accordance with a variation of the third embodiment.
Figure 14B:
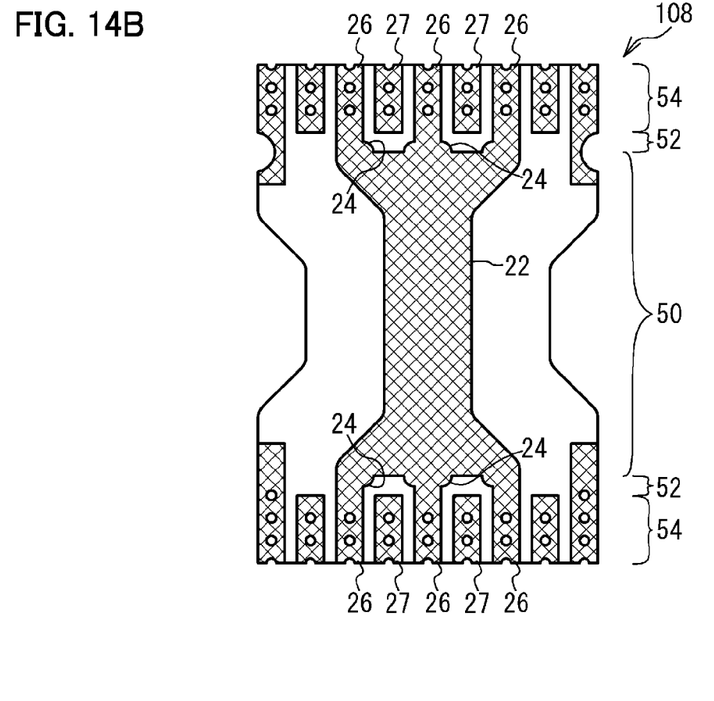

FIGS. 14A and 14B are respectively plan views of first and second surfaces of another flexible circuit board in accordance with a variation of the third embodiment. The connection lines 14 of a flexible circuit board 108 have rectangular openings 15. The signal lines 16 of the coplanar lines 54 are electrically connected to electrodes 27 on the second surface through via metals 28. The other structures of the flexible circuit board in FIGS. 11A and 11B are the same as those of the flexible circuit board of the third embodiment illustrated in FIGS. 11A and 11B, and a description thereof is omitted here. The openings 15 may have rectangular shapes or another shape. The electrodes 27 may be formed on the second surface so as to be located in areas corresponding to the signal lines 16 of the coplanar lines 54, and may be electrically connected to the signal lines 27.

The openings 15 may have pentagonal shapes or structures. The openings 15 may have quadrilateral or trapezoidal shapes or structures.

The present invention is not limited to the specifically described embodiments and variations, but other embodiments and variations may be made without departing from the scope of the present invention.

What is claimed is:

1. A flexible circuit board comprising:
    an insulative substrate having a first surface and a second surface opposite to the first surface;
    a microstrip line having a first signal line formed on the first surface and a first ground pattern formed on the second surface and located in an area opposite to the first signal line;
    a coplanar line having a second signal line formed on the first surface, and second ground patterns that are formed on the first surface and are spaced apart from both sides of the second signal line;
    a connection line that is formed on the first surface and connects the first signal line and the second signal line together, the connection line having an opening; and
    third ground patterns formed on the second surface and arranged in areas located at both sides of an area opposite to the connection line including the opening.

2. The flexible circuit board according to claim 1, wherein the connection line includes branch lines defined by the opening, and one of the branch lines that is substantially as wide as the first signal line and is aligned with the first signal line.

3. The flexible circuit board according to claim 1, further including ground patterns that are provided on the second surface and are located in areas opposite to the second ground patterns.

4. The flexible circuit board according to claim 3, wherein the third ground patterns are away from the second signal line by a distance larger than that by which the second signal line is away from the second ground patterns.

5. The flexible circuit board according to claim 1, wherein the coplanar line has a characteristic impedance smaller than that of the microstrip line.

6. The flexible circuit board according to claim 1, wherein the flexible circuit board includes a plurality of sets of lines, each of which sets includes the microstrip line, the coplanar line and the connection line, and adjacent coplanar lines share the second ground pattern.

7. The flexible circuit board according to claim 1, wherein the opening of the connection line has a pentagonal structure.

8. The flexible circuit board according to claim 1, wherein the opening of the connection line has a quadrilateral structure.

9. The flexible circuit board according to claim 1, wherein the opening of the connection line has a trapezoidal structure.

10. The flexible circuit board according to claim 1, wherein the ground patterns and the third ground patterns are interconnected by via metals.

11. The flexible circuit board according to claim 3, wherein a width of the second ground patterns is larger than a width of the ground patterns.

12. The flexible circuit board according to claim 3, wherein the second ground patterns is as long as the ground patterns.

13. An optical module comprising:
    a flexible circuit board including:
        an insulative substrate having a first surface and a second surface opposite to the first surface,
        a microstrip line having a first signal line formed on the first surface and a first ground pattern formed on the second surface and located in an area opposite to the first signal line,
        a coplanar line having a second signal line formed on the first surface, and second ground patterns that are formed on the first surface and are spaced apart from both sides of the second signal line,
        a connection line that is formed on the first surface and connects the first signal line and the second signal line together, the connection line having an opening; and
        third ground patterns formed on the second surface and arranged in areas located at both sides of an area opposite to the connection line including the opening;
    an optical sub-assembly having a receptacle, a housing, lead pins and an insulator; and
    a circuit board connected to the optical sub-assembly via the flexible circuit board transmitting RF signals.

14. The optical module according to claim 13, wherein the lead pins are jointed to the second signal line and the second ground patterns.

15. The optical module according to claim 14, wherein the lead pins are jointed to an area except the opening of the connection line.

\* \* \* \* \*